United States Patent [19]
Costa et al.

[11] Patent Number: 6,158,832
[45] Date of Patent: Dec. 12, 2000

[54] FASTENER WITH ALIGNMENT AND SPACING FEATURES

[75] Inventors: Richard Sander Costa, Bedminster; Daniel Plaza, Mendham, both of N.J.

[73] Assignee: Lucent Technologies Inc., Murray Hill, N.J.

[21] Appl. No.: 09/196,241

[22] Filed: Nov. 20, 1998

[51] Int. Cl.[7] .................................................. A47B 96/00
[52] U.S. Cl. ..................... 312/326; 312/223.1; 312/296; 312/245; 411/401; 411/919; 248/552
[58] Field of Search .............................. 312/293.1, 293.2, 312/326, 327, 328, 329, 296, 223.2, 223.1, 242, 245, 248, 349; 361/728, 730; 292/300, 329, DIG. 11; 411/401, 402, 919, 410; 455/347, 348, 349, 351; 248/552; 49/498.1, 501

[56] References Cited

U.S. PATENT DOCUMENTS

| 2,340,864 | 2/1944 | Carpenter | 411/402 X |
| 2,754,991 | 7/1956 | Hagerty et al. | 312/248 X |
| 3,854,372 | 12/1974 | Gutshall | 411/402 X |
| 4,085,650 | 4/1978 | Flynn | 292/300 X |
| 4,267,870 | 5/1981 | Warner | 411/410 X |
| 5,303,965 | 4/1994 | Meehan | 292/DIG. 30 X |
| 5,810,531 | 9/1998 | Tershay | 411/410 X |
| 5,826,957 | 10/1998 | DeBartolo, Jr. et al. | 312/326 |

*Primary Examiner*—Janet M. Wilkens

[57] ABSTRACT

A combination fastener for attaching a cellular phone base station to a mounting bracket includes alignment and spacing features. The alignment features ensure that a door of the base station will be properly aligned when the door closed. The spacing features ensure that a gasket for the door will be placed under proper compression by the closed door.

20 Claims, 6 Drawing Sheets

FASTENER WITH ALIGNMENT AND SPACING FEATURES

BACKGROUND OF THE INVENTION

1. Field of the Invention

The present invention relates to a fastener for attaching a first object to a second object, with the fastener including structural features for guiding a third object into a predetermined alignment and spacing relative to the attached first and second objects. More specifically, the present invention relates to a fastener for attaching a housing of a cellular phone base station to a mounting bracket. The fastener includes structural features for engagement with a door of the housing of the base station so that the door is brought into proper alignment and spacing relative to the housing.

2. Description of the Background Art

Cellular phone service coverage areas often include manmade structures which act as barriers obstructing the signals necessary for providing phone service. Obstacles, such as tunnels and closely-knit skyscrapers, can create areas of reduced signal strength within the coverage area. These reduced signal strength areas are often referred to as dark zones.

Cellular phone users can be greatly inconvenienced by these dark zones. For instance, the cellular phone user may be unable to place a call, or may have an active call dropped when passing through a dark zone. Adding to the inconvenience is the fact that these dark zones can occur in the very heart of the intended coverage area.

Supplemental cellular phone base stations, or patch stations, are known in the existing arts. The purpose of the supplement base station is to brighten the dark zone. The base station is physically connected to a fixed structure adjacent to the dark zone, such as a building, bridge or tunnel, via a mounting bracket.

The supplemental base station has traditionally been contained within a rather bulky housing. The housing enclosed many pounds of electrical components necessary to the base station's functions. In order to shield the electrical components, provide adequate heat dissipation, and simply support the electrical components, the housing and the door to the housing have to be formed of a rigidified material, typically aluminum.

Figure 6:
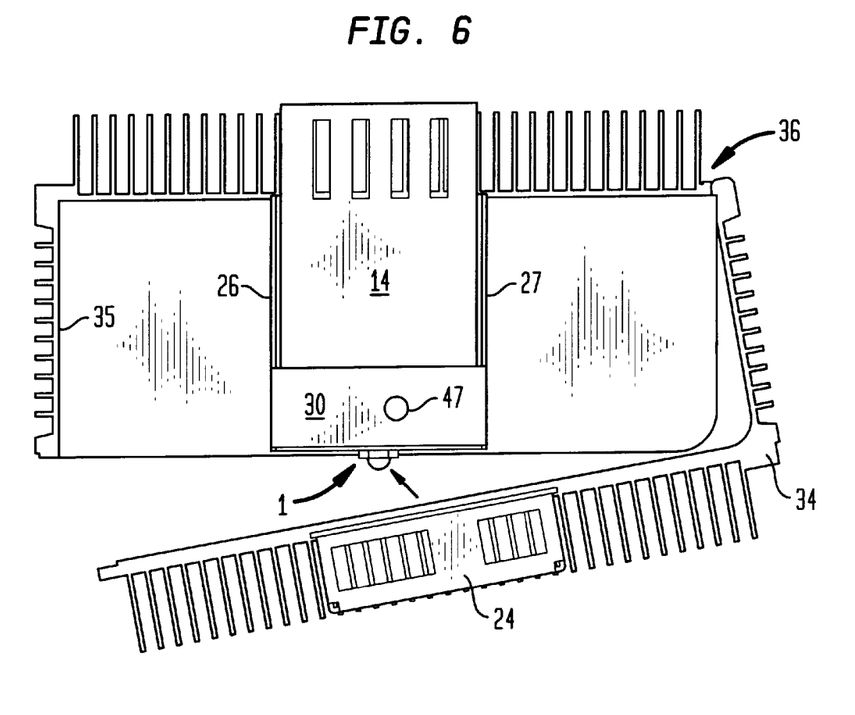
FIG. 6 is top view illustrating the base station secured to the mounting bracket with the door nearly closed.

In an effort to reduce the overall size and weight of the base station, the Applicants' have invented a housing having a door formed by two adjacent walls of the housing (See FIG. 6).

The expanded door provides a wide access opening to the interior of the housing. The expanded door allows easy access to multiple layers of stacked components within the housing. Therefore, the components can be made smaller and be packed more densely within the housing, while still allowing adequate access for service and repair operations.

During installation, the housing must be secured to a mounting bracket. After installation, the expanded door must be proper aligned to the walls of the housing when the door is being closed. Further, the expanded door must be spaced a proper distance from the walls of the housing, when closed, so as to properly compress a weatherproofing gasket. To this end, there exists a need in the art for a combination fastener, alignment guide, and spacer for interconnecting and/or interacting with the mounting bracket, housing, and door.

SUMMARY OF THE INVENTION

Accordingly, it is a primary object of the present invention to provide a fastener device for connecting the housing to the mounting bracket.

Another object of the present invention is to provide an alignment device for guiding the door into proper alignment with the housing when the door is being closed.

Yet another object of the present invention is to provide a spacing device for spacing the door a predetermined distance from walls of the housing so that a weatherproofing gasket will be properly compressed between the door and the walls of the housing.

These and other objects of the present invention are fulfilled by providing A fastener for attaching a first object to a second object and for aligning a third object relative to the connected first and second objects, said fastener comprising: a cylindrical shaft having an outer surface, a first end and a second end; threading formed at a first portion of said outer surface of said cylindrical shaft portion; a head attached to said second end; and an alignment feature attached to said head.

Moreover, these and other objects of the present invention are fulfilled by providing a combination of a combination comprising: a housing having a through hole; a fastener including: a cylindrical shaft having an outer surface, a first end and a second end; threading formed at a first portion of said outer surface of said cylindrical shaft portion; a head attached to said second end; and a first alignment feature attached to said head, wherein said cylindrical shaft is engaged within said through hole of said housing; and a door pivotably attached to said housing for providing access to said housing, said door having a second alignment feature, wherein said second alignment feature of said door cooperates with said first alignment feature of said fastener to align said door relative to said housing, when said door is closed relative to said housing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
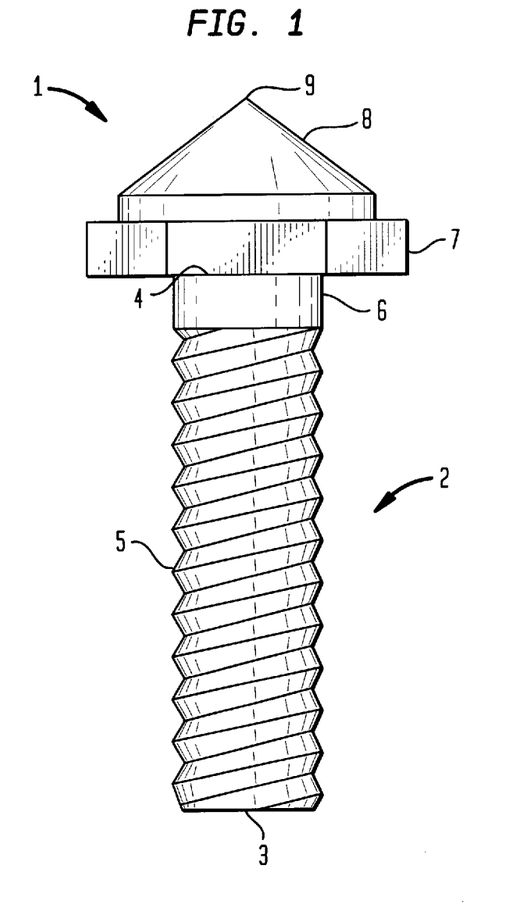
FIG. 1 is a side view of a combination fastener device, in accordance with the present invention.
Figure 2:
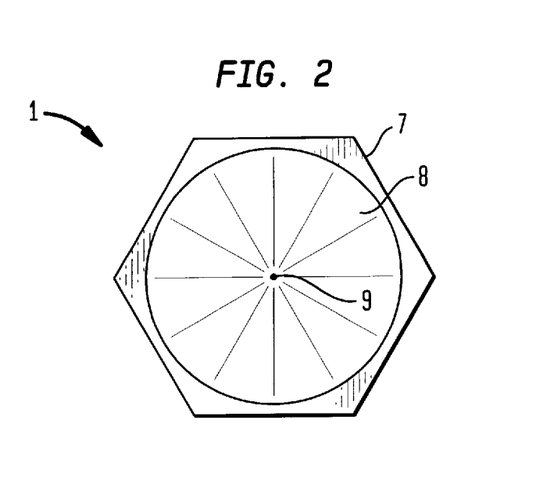
FIG. 2 is a top view of the combination fastener device of FIG. 1.

Referring in detail to the drawings and with particular reference to FIGS. 1 and 2, a fastener device 1, in accordance with the present invention, includes a cylindrical shaft 2 with an outer surface, a first end 3 and a second end 4. A first portion 5 of the outer surface includes threading formed thereat, such as by cutting threading into the first portion 5. The first portion 5 is formed adjacent the first end 3 of the cylindrical shaft 2. A second portion 6 of the outer surface is non-threaded, preferably having a smooth surface. The second portion 6 is adjacent the second end 4 of the cylindrical shaft 2.

The combination fastener 1 also includes a head 7 formed at the second end 4 of the cylindrical shaft 2. The head 7 has a perimeter that extends beyond the outer surface of the second portion 6. The perimeter is preferably formed as a hexagon (See FIG. 2) so that the perimeter may be engaged by a tool, such as a socket or wrench. Attached to the head 7 is a first alignment feature 8. The first alignment feature 8 is a projection extending away from the head 7. The projection has a conical shape which tapers to a point 9 in a direction away from the head 7.

Although FIGS. 1 and 2 illustrate the outer perimeter of the head 7 as hexagonal, it is envisioned that the outer perimeter could have other shapes, such as circular. In this embodiment, a center section of the projection would be formed with an indented portion, adapted to receive an allen wrench, a star-shaped driver, etc. Also, the shape of the first alignment feature 8 need not be conical, but rather could be in the shape of a pyramid, half an egg-shape, etc.

Figure 3:
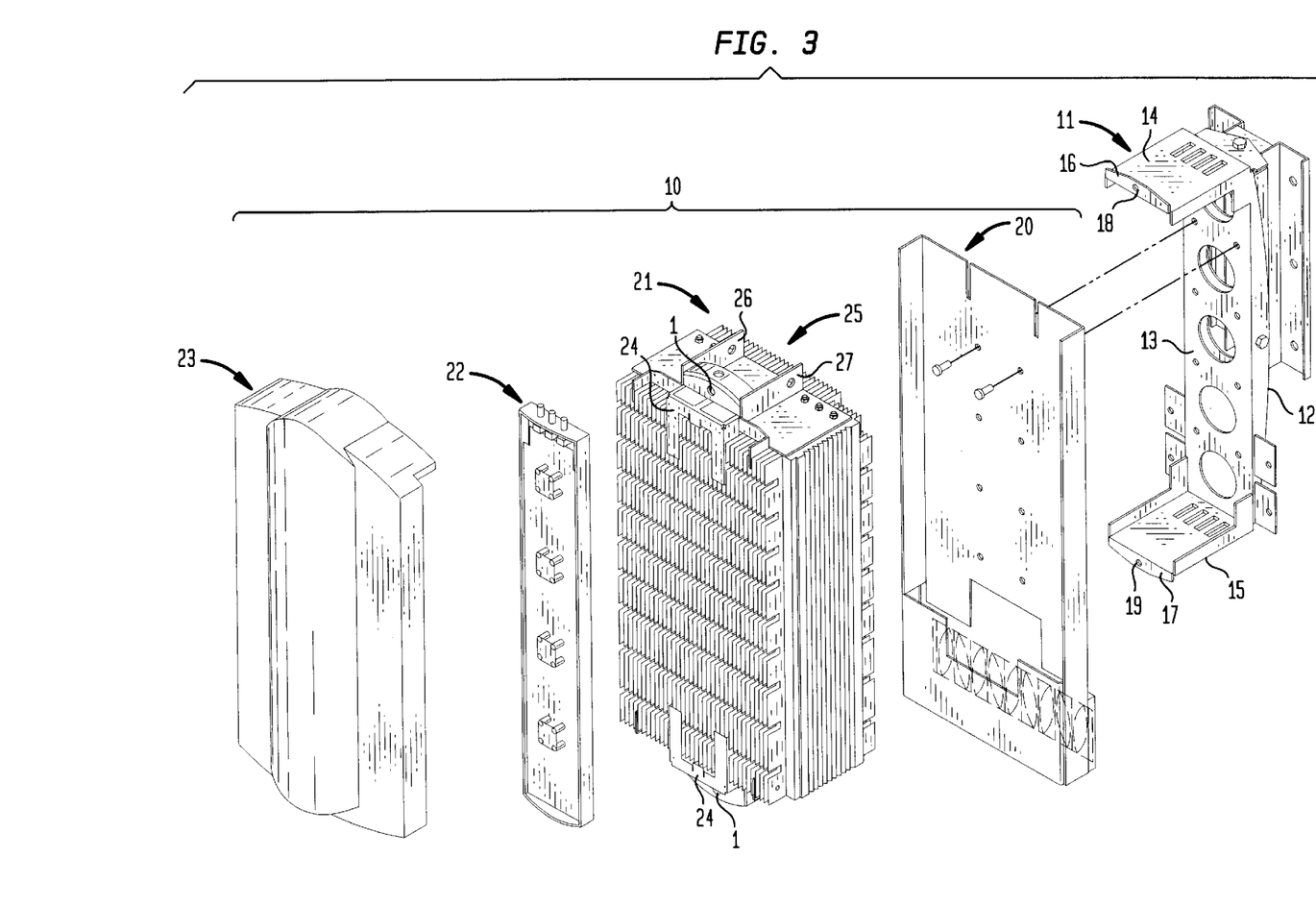
FIG. 3 is exploded, perspective view illustrating a base station, door, and mounting bracket.
Figure 4:
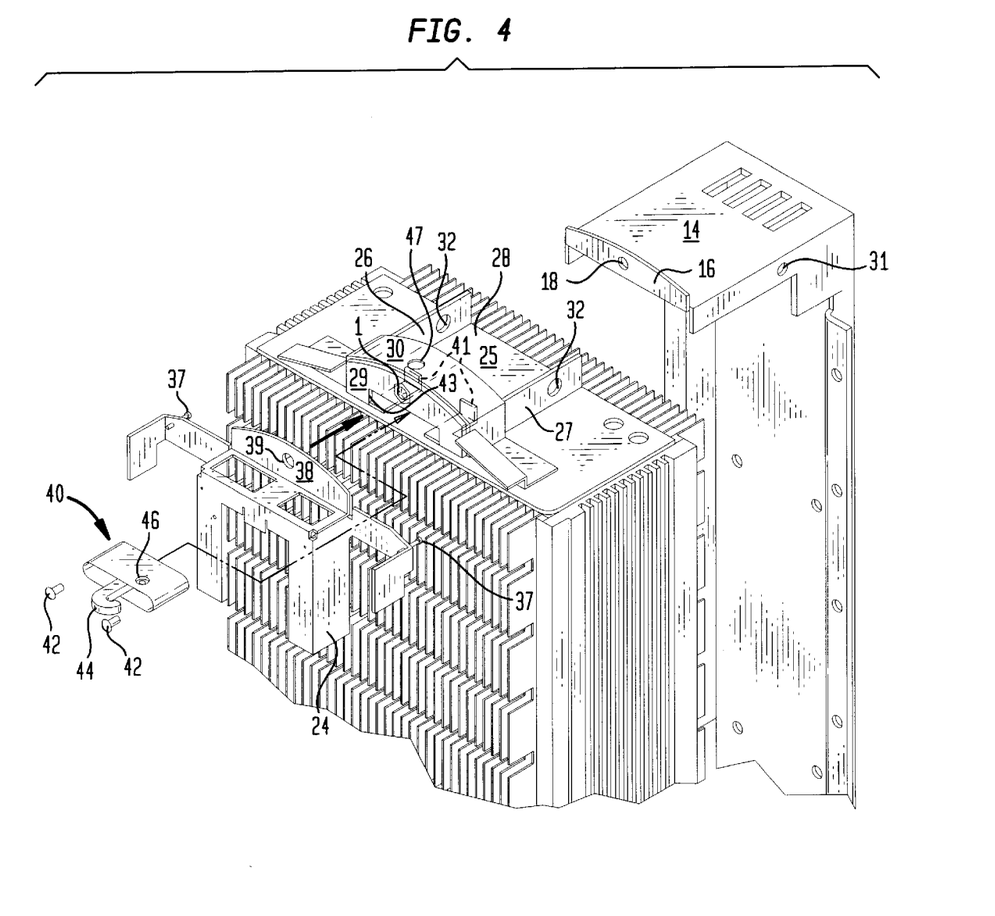
FIG. 4 is a close-up exploded view illustrating the area surrounding the combination fastener.

Now, with reference to FIGS. 3 and 4, one use of the combination fastener 1 will be disclosed in conjunction with a cellular phone base station 10 and a mounting assembly 11. The mounting assembly 11 is the subject of Applicants' co-pending application entitled "ADJUSTABLE MOUNTING BRACKET," filed on Nov. 20, 1998, the contents of which are hereby incorporated by reference.

For the purposes of understanding the combination fastener of the present invention, it should be noted that the mounting assembly 11 includes a bracket 12 with a generally planar base 13. A first member 14 and a second member 15 are provided on distal ends of the base 13. The first and second members 14 and 15 extend perpendicularly away from the base 13 at approximately ninety degree angles.

A first flange 16 is provided at an end of the first member 14 remote from the connection between the base 13 and the first member 14. A second flange 17 is provided at an end of the second member 15 remote from the connection between the base 13 and the second member 15. The first flange 16 includes a hole 18 with internal threading. The second flange 17 includes a hole 19 with internal threading.

The cellular phone base station 10 includes a baffle fan assembly 20, a housing 21, a directional antenna 22, and a solar shield 23. When assembled, the directional antenna 22 is attached to supports 24 fixed to the housing 21 and the solar shield 23 is fitted to the directional antenna 22. The housing 21 is formed of an aluminum material and includes a plurality of heat sinks on its outer surface. The upper surface of the housing 21 includes a first channel 25 formed between two upstanding ears 26 and 27.

As illustrated in FIG. 4, a rear end 28 of the first channel 25 is open. A front end of the first channel 25 is closed by a first stop plate 29. The two upstanding ears 26 and 27 are joined to one another, adjacent the stop plate 29, by a hood 30. The hood 30 is used as a handle by a service technician when carrying the housing 21. The lower surface of the housing 21 is a mirror image of the upper surface. Therefore, the lower surface includes a second channel formed between two ears, a second stop plate, and a second hood.

To attach the cellular phone base station to the mounting assembly 11. The service technician picks the housing 21 up by the first and second hoods 30. Next, the first member 14 is engaged within the first channel 25 and the second member 15 is engaged within the second channel. The spacing between the first member 14 and the second member 15 is nearly equal to the height of the housing 21 as measured from the upper surface to the lower surface. Therefore, the engagement of the first and second members 14, 15 into the channels occurs almost simultaneously.

Next, the housing 21 is slid toward the base 13 of the bracket 12, until the first flange 16 abuts the first stop plate 29 and the second flange 17 abuts the second stop plate. As illustrated in FIG. 4, when the first and second flanges 16, 17 abut the stop plates 29, two bubbled portions 31 formed on the first member 14 will snap into two openings 32 formed in the upstanding ears 26, 27. It is also foreseeable that bubbled portions formed on the second member 15 would snap into openings formed in the ears of the second channel on the 10 lower surface of the housing 21. The snap fit of the bubbled portions 31 causes the housing 21 to be temporarily secured to the mounting assembly 11 so that the service technician can release the housing 21.

The stop plates 29 of the housing 21 each include the combination fastener 1. Each combination fastener 1 is captured inside a through hole 33 formed in the stop plate 29. The combination fastener 1 is captured because the diameter of the through hole 33 is slightly greatly than a diameter of the second portion 6 of the cylindrical shaft 2, but less than the diameter of the first portion 5 of the cylindrical shaft 2.

The threading provided at the first portion 5 of the combination fasteners 1 is sized to thread into the first and second threaded holes 18, 19 of the first and second flanges 16, 17, respectively. To firmly secure the housing 21 to the mounting assembly 11, the service technician tightens the combination fasteners 1 by applying a tool, such as a socket or wrench, to the head 7. By this arrangement the combination fastener 1 can firmly secure the housing 21 to the mounting assembly 11.

Figure 5:
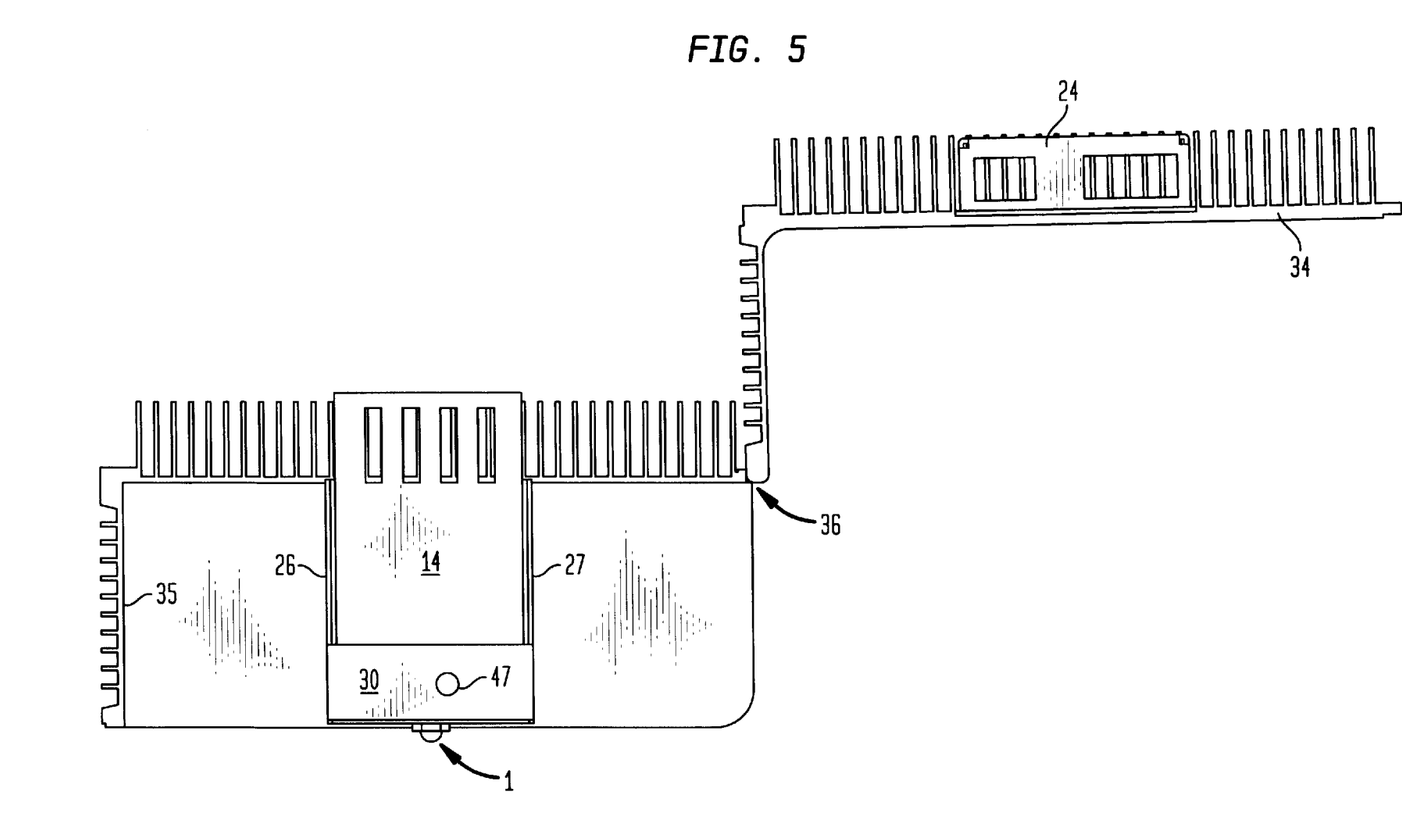
FIG. 5 is a top view illustrating the base station secured to the mounting bracket, with the door fully open.

Now, the function of the combination fastener 1 in aligning and spacing a door 34 will be described in relation to FIGS. 5–8. The housing 21 includes a housing body 35 and the door 34. The door 34 is pivotally attached to a housing body 35 via a hinge 36. As illustrated in FIG. 5, when the door 34 is fully opened, wide access is provided to the interior of the housing body 35 so that electrical components within can be easily serviced.

Figure 7:
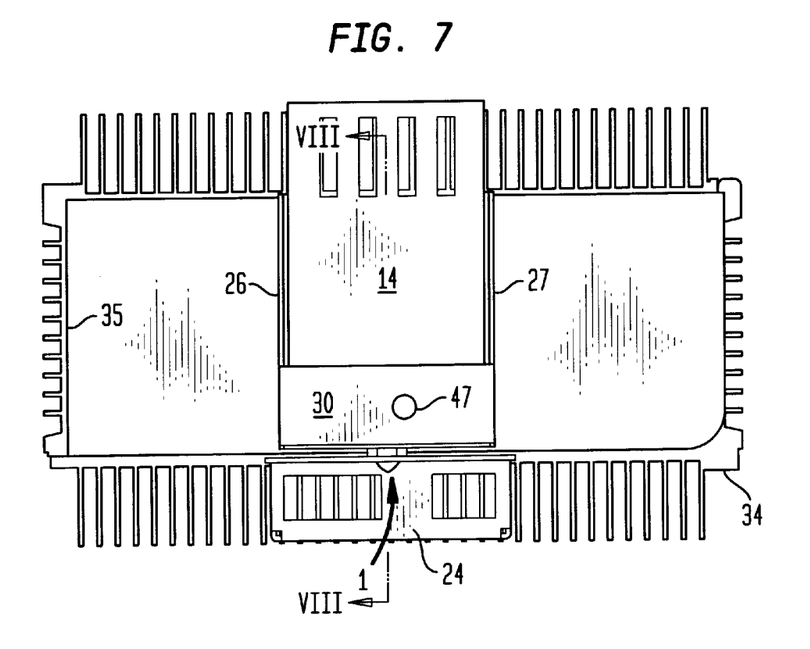
FIG. 7 is a top view illustrating the base station secured to the mounting bracket with the door completely closed.

The door 34 has to travel quite a distance between the fully open position (FIG. 5) and the fully closed position (FIG. 7). Relatively large moments and forces are involved in the swinging of the door 34 and play upon the hinge 36. Therefore, in order to accommodate this swinging movement, one would expect that the hinge 36 would have to be an expensive, robust hinge and that the hinge 36 would have to be precisely aligned so that the door 34 would close in proper alignment with the housing body 35. However, in accordance with the present invention, the hinge 36 may be relatively inexpensive and the alignment of the hinge 36 need not be precise.

By the present invention, the supports 24, which were described above for attaching the antenna 22, are attached to upper and lower portions of the door 34 using screws 37. The supports 24 also serve an additional function of assisting in the alignment of the door 34 when the door 34 is being closed.

Figure 8:
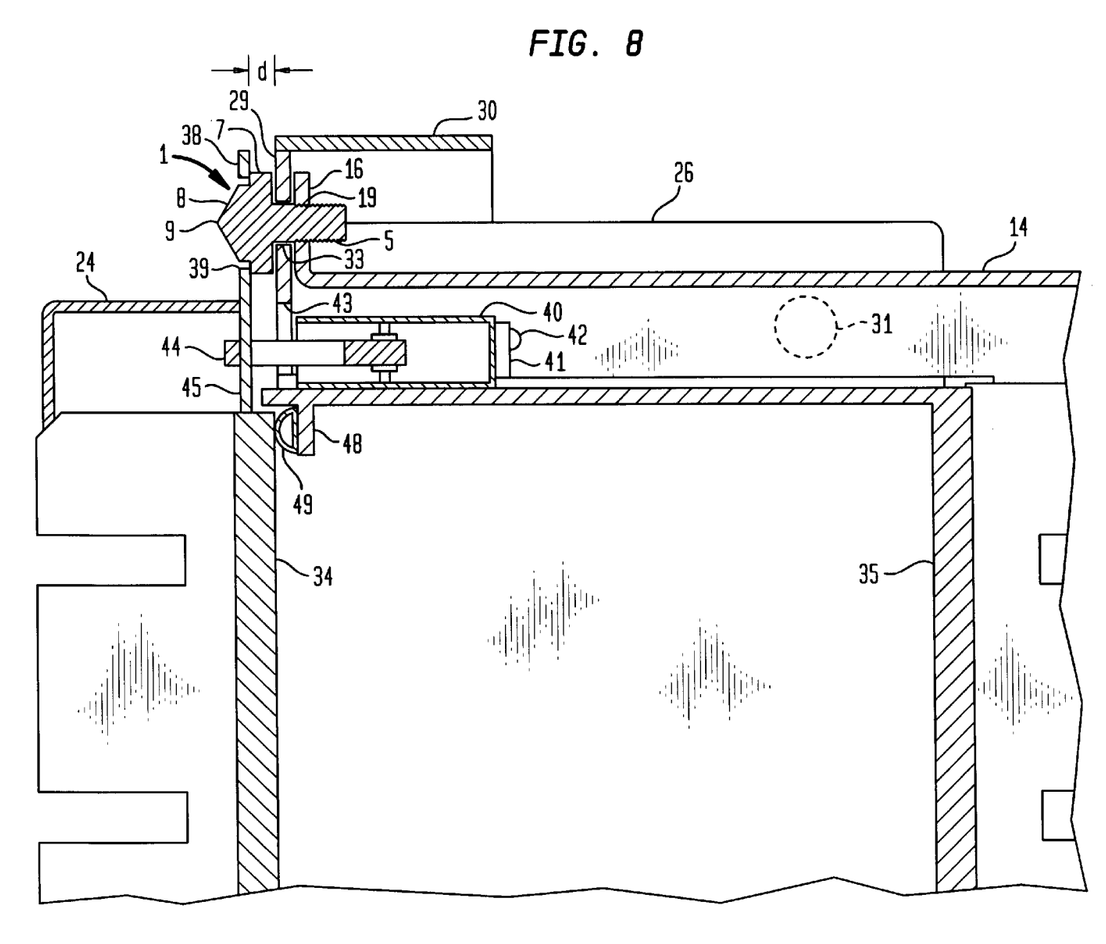
FIG. 8 is a cross sectional view taken along line VIII—VIII in FIG. 7.

With reference to FIGS. 4 and 8, it can be seen that each support 24 includes a tab 38. A central portion of the tab 38 includes a second alignment feature 39, in the form of a through hole. As the door 34 is being closed the first alignment feature 8 of the combination fastener 1, the conical projection described above, engages with the second alignment feature 39. As the conical shape feeds into the through hole of the second alignment feature 39, the door 34 is brought into proper alignment with the housing body 35.

Now with reference to FIGS. 4 and 8, the spacing feature of the combination fastener 1 will be described. In order to secure the door 34 to the housing body 35, a latch 40 is provided. The latch 40 is attached to a pair of upstanding L-shaped brackets 41 by a pair of screws 42. The upstanding L-shaped brackets are welded to an upper surface of the housing body 35 underneath the hood 30. An opening 43 is provided in the stop plate 29. A hook portion 44 of the latch 40 extends through the opening 43. The latch 40 also includes a locking activator 46. When the latch 40 is installed, the locking activator 46 will be in alignment with a through hole 47 formed in the hood 30.

Inside the support 24 there is an engagement pin 45. When the door is closed, the hook portion 44 will snap over the engagement pin 45. In order to draw the door closed and secure the door in the closed position, a service technician inserts a tool through the through hole 47 formed in the hood 30 and engages and rotates the locking activator 46.

Inside the housing body 35 there is provided a gasket flange 48 and a gasket 49. Of course, the gasket 49 could be attached to the door 34 instead of the gasket flange 48. It is important that the door 34 completely abut the gasket 49. It is also important that the door 34 not over compress the gasket 49. Over compression can lead to premature deterioration of the gasket 49 and failure of the weatherproofing characteristics of the gasket 49.

The head 7 of the combination fastener 1 plays an important role in ensuring the proper compression of the gasket 49. A thickness "d" of the head 7, taken in a longitudinal extension direction of the cylindrical portion 2, is uniform. This thickness "d" is preselected so that a predetermined level of compression will be applied to the gasket 49 when the door 34 is latched shut by turning the locking activator 46.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fastener for attaching a first object to a second object and for aligning a third object relative to the connected first and second objects, said fastener comprising:
    a cylindrical shaft having an outer surface, a first end and a second end;
    threading formed at a first portion of said outer surface of said cylindrical shaft;
    a head attached to said second end; and
    an alignment feature attached to said head, wherein said alignment feature is a protrusion extending away from said head and said protrusion has a conical shape, with a tapered end pointing away from said head.

2. The fastener according to claim 1, wherein said first portion is adjacent said first end, and further comprising a non-threaded second portion adjacent said second end.

3. The fastener according to claim 1, wherein said head extends beyond said outer surface of said cylindrical shaft.

4. The fastener according to claim 1, wherein said head is integrally formed with said cylindrical shaft and wherein said alignment feature is integrally formed with a central portion of said head.

5. The fastener according to claim 1, wherein said head has an outer perimeter in the shape of a hexagon.

6. The fastener according to claim 5, wherein said head has a uniform thickness taken in a direction parallel to an extension direction of said cylindrical shaft.

7. A combination comprising:
    a housing having a through hole;
    a fastener including: a cylindrical shaft having an outer surface, a first end and a second end; threading formed at a first portion of said outer surface of said cylindrical shaft; a head attached to said second end; and a first alignment feature attached to said head, wherein said cylindrical shaft is engaged within said through hole of said housing;
    a mounting bracket, said mounting bracket including a threaded hole, wherein said threading of said cylindrical shaft is engaged within said threaded hole to attach said housing to said mounting bracket; and
    a door pivotably attached to said housing for providing access to said housing, said door having a second alignment feature, wherein said second alignment feature of said door cooperates with said first alignment feature of said fastener to align said door relative to said housing, when said door is closed relative to said housing.

8. The combination according to claim 7, wherein said head has a uniform thickness taken in a direction parallel to an extension direction of said cylindrical shaft, and further comprising:
    a gasket formed on said housing for abutting against said door, when said door is closed relative to said housing, wherein said uniform thickness of said head allows said door to compress said gasket a predetermined amount, when said door is closed relative to said housing.

9. The combination according to claim 7, further comprising:
    a first latching feature attached to said housing;
    a second latching feature attached to said door, wherein said door is closed relative to said housing by an engagement between said first and second latching features.

10. The combination according to claim 7, wherein said first portion having said threading is adjacent said first end of said cylindrical shaft, and further comprising a non-threaded second portion adjacent said second end, and wherein said non-threaded second portion is captured within said through hole of said housing.

11. The combination according to claim 7, wherein said first alignment feature is a protrusion extending away from said head of said fastener and said second alignment feature is a hole formed in said door.

12. The combination according to claim 11, wherein said protrusion has a conical shape, with a tapered end pointing away from said head.

13. The combination according to claim 7, wherein said head is integrally formed with said cylindrical shaft and wherein said first alignment feature is integrally formed with a central portion of said head.

14. The combination according to claim 7, wherein said head has an outer perimeter in the shape of a hexagon.

15. A combination comprising:

a housing having a through hole;

a fastener including: a cylindrical shaft having an outer surface, a first end and a second end; threading formed at a first portion of said outer surface of said cylindrical shaft; a head attached to said second end; and a first alignment feature attached to said head, wherein said cylindrical shaft is engaged within said through hole of said housing; and a door pivotably attached to said housing for providing access to said housing, said door having a second alignment feature, wherein said second alignment feature of said door cooperates with said first alignment feature of said fastener to move said door into alignment relative to said housing, when said door is closed relative to said housing.

16. The combination according to claim 15, further comprising:

a mounting bracket, said mounting bracket including a threaded hole, wherein said threading of said cylindrical shaft is engaged within said threaded hole to attach said housing to said mounting bracket.

17. The combination according to claim 15, wherein said head has a uniform thickness taken in a direction parallel to an extension direction of said cylindrical portion, and further comprising:

a gasket formed on said housing for abutting against said door, when said door is closed relative to said housing, wherein said uniform thickness of said head allows said door to compress said gasket a predetermined amount, when said door is closed relative to said housing.

18. The combination according to claim 15, further comprising:

a first latching feature attached to said housing;

a second latching feature attached to said door, wherein said door is closed relative to said housing by an engagement between said first and second latching features.

19. The combination according to claim 15, wherein said first portion having said threading is adjacent said first end of said cylindrical shaft, and further comprising a non-threaded second portion adjacent said second end, and wherein said non-threaded second portion is captured within said through hole of said housing.

20. The combination according to claim 15, wherein said first alignment feature is a protrusion extending away from said head of said fastener with said protrusion having a conical shape, with a tapered end pointing away from said head, and wherein said second alignment feature is a hole formed in said door.

* * * * *